United States Patent
Kao

(10) Patent No.: US 6,653,692 B2
(45) Date of Patent: Nov. 25, 2003

(54) DOUBLE ACCESS PATH MASK ROM CELL STRUCTURE

(75) Inventor: Jinn-Nan Kao, Hsinchu (TW)

(73) Assignee: Holtek Semiconductor Inc., Hsinchu (TW)

( * ) Notice: Subject to any disclaimer, the term of this patent is extended or adjusted under 35 U.S.C. 154(b) by 0 days.

(21) Appl. No.: 10/114,479

(22) Filed: Apr. 3, 2002

(65) Prior Publication Data

US 2003/0189846 A1 Oct. 9, 2003

(30) Foreign Application Priority Data

Nov. 2, 2001 (TW) ...................................... 90218739 U

(51) Int. Cl.[7] .......................................... H01L 31/113
(52) U.S. Cl. ...................................... 257/390
(58) Field of Search ...................... 257/202–211, 390; 438/128, 129, 309, 257, 587, 598; 365/63, 94, 103

(56) References Cited

U.S. PATENT DOCUMENTS

| | | | | | |
|---|---|---|---|---|---|
| 5,117,389 | A | * | 5/1992 | Yiu | 365/104 |
| 5,453,392 | A | * | 9/1995 | Hong et al. | 438/278 |
| 5,631,481 | A | * | 5/1997 | Hsue et al. | 257/314 |
| 5,892,713 | A | * | 4/1999 | Jyouno et al. | 365/185.11 |
| 6,084,794 | A | * | 7/2000 | Lu et al. | 365/104 |
| 6,150,700 | A | * | 11/2000 | Lee | 257/391 |

* cited by examiner

Primary Examiner—David Nelms
Assistant Examiner—Long Tran
(74) Attorney, Agent, or Firm—Troxell Law Office PLLC

(57) ABSTRACT

The present invention discloses a double access path mask read-only memory cell array structure, characterized in that the stored data is accessed simultaneously through two access paths disposed on both sides of a memory cell array structure. The reliability is improved since the value 0 or 1 stored in the data can be accessed through two paths and the operation speed is enhanced since the resistance in the conductive path from the sense amplifier to the ground is effectively reduced when accessing 0.

12 Claims, 4 Drawing Sheets

DOUBLE ACCESS PATH MASK ROM CELL STRUCTURE

BACKGROUND OF THE INVENTION

1. Field of the Invention

The present invention generally relates to a mask read-only memory (to be abbreviated as ROM hereafter) array structure and, more particular, to a mask ROM array structure employing a double access path to access the data simultaneously so as to achieve high reliability and high-speed operation.

2. Description of the Prior Art

In recent years, due to the increasing need for the performances in terms of speed, size, power consumption and ease of fabrication of electronic products, the electronics industry has made a lot of efforts on semiconductor processing techniques for downsized and highly integrated devices on the one hand. On the other hand, concerning IC design, there has been provided with new layout approaches in accordance with the state-of-the-art processing techniques so as to obtain an overall improvement in reliability as well as in operation speed.

Many prior arts have been disclosed, such as the U.S. Pat. No. 5,117,389 entitled "Flat-cell read-only memory integrated circuit" filed by Yiu et al (Macronix International Co., Ltd., Taiwan) and the U.S. Pat. No. 6,084,794 entitled "High speed Flat-cell mask ROM structure with select lines" filed by Lu et al (Winbond Electronics.Corp., Ltd., Taiwan.) The performance of a ROM is easily affected by the access path during data access since the equivalent resistance and the parasitical capacitance in the conductive path depend on the access path.

Please refer to FIG. 1, which is a schematic circuit diagram in accordance with the U.S. Pat. No. 5,117,389. Within this circuit design architecture, for example, when a data in the cell array is to be accessed, it can be chosen either by the bank left select transistor $SBL_N$ or the bank right select transistor $SBR_N$. Then through the block select transistors M1 and M2 and the contact holes 100-1 and 100-2, a conductive path is formed from the virtual ground $VG_N$ to the metal data line $BL_N$. Thereafter, the value 1 or 0 stored in the memory cell C is accessed via the metal data line $BL_N$ by the sense amplifier. The conductive path can expressed as:

$$VG_N \to 100\text{-}1 \to M1 \to L2 \to C \to M2 \to 100\text{-}2 \to BL_N$$

Please refer to FIG. 2, which is a schematic circuit diagram in accordance with the U.S. Pat. No. 6,084,794. Within this circuit design architecture, for example, when the data in the cell array is to be accessed, one of even memory cell C00 or odd memory cell C01 is chosen by the even select line ESi or the odd select line Osi respectively. Then through the block select transistors B0 and B1 and the contact holes (not shown), a conductive path is formed from the metal bit line $BL_{i-1}$ to the metal bit line $BL_i$. Thereafter, the stored value 1 or 0 is accessed via the metal bit line $BL_i$ by the sense amplifier. For example, when the data stored in the even memory cell C00 is to be accessed, the conductive path can expressed as:

$$BL_{i-1} \to B0 \to C00 \to E1 \to BL_i$$

Accordingly, the resistance in the conductive path in a flat-cell ROM is relatively large. When 0 is to be accessed, the current will be suppressed and a large voltage drop occurs across the $n^+$-buried region due to large resistance. Since the large voltage drop across the $n^+$-buried region reduces the pull low margin of the sense amplifier, the operation condition becomes critical. On the other hand, the suppressed current prolongs the pull low time for accessing 0 and thus decreases the operation speed.

Therefore, there is need for providing a novel circuit architecture design that can effectively improve the reliability and the operation speed.

SUMMARY OF THE INVENTION

It is the primary object of the present invention to provide a double access path mask ROM array structure employing a double access path to access the data simultaneously so as to improve high reliability operation.

It is another object of the present invention to provide a double access path mask ROM array structure employing a double access path such that the operation speed when accessing 0 is enhanced since the equivalent resistance is the parallel resistance of the independent conductive paths.

In order to achieve the foregoing objects, the present invention provides a double access path mask ROM array structure, comprising a plurality of pairs of banks, wherein said each pair of bank comprises: a plurality of $n^+$-buried regions formed on a substrate to function as part of a first access path and part of a second access path; an insulating layer of substantially constant thickness formed on said substrate; a plurality of contact holes penetrating said insulating layer, wherein two of said contact holes construct a conductive path to the ground and another two of said contact holes construct a conductive path to an external sense amplifier; a plurality of block select transistors; a plurality of select cell transistors; a plurality of conductive bit lines, connecting the sources of said different block select transistors to said respective contact holes; a plurality of word lines; a cell array composed of said plurality of word lines to store data; and, a first metal line and a second metal line, forming part of a double access path.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms. Like numerals refer to like parts throughout the disclosure.

BRIEF DESCRIPTION OF THE DRAWINGS

The objects, spirits and advantages of the preferred embodiment of the present invention will be readily understood with reference to the accompanying drawings and detailed descriptions, wherein.

DETAILED DESCRIPTION OF THE INVENTION

The present invention provides a double access path mask read-only memory array structure, characterized in that the stored data is accessed simultaneously through two access paths disposed on both sides of a memory array structure. The reliability is improved since the value 0 or 1 stored in the data can be accessed through two paths and the operation speed is enhanced since the resistance in the conductive path from the sense amplifier to the ground is effectively reduced when accessing value 0.

Figure 1:
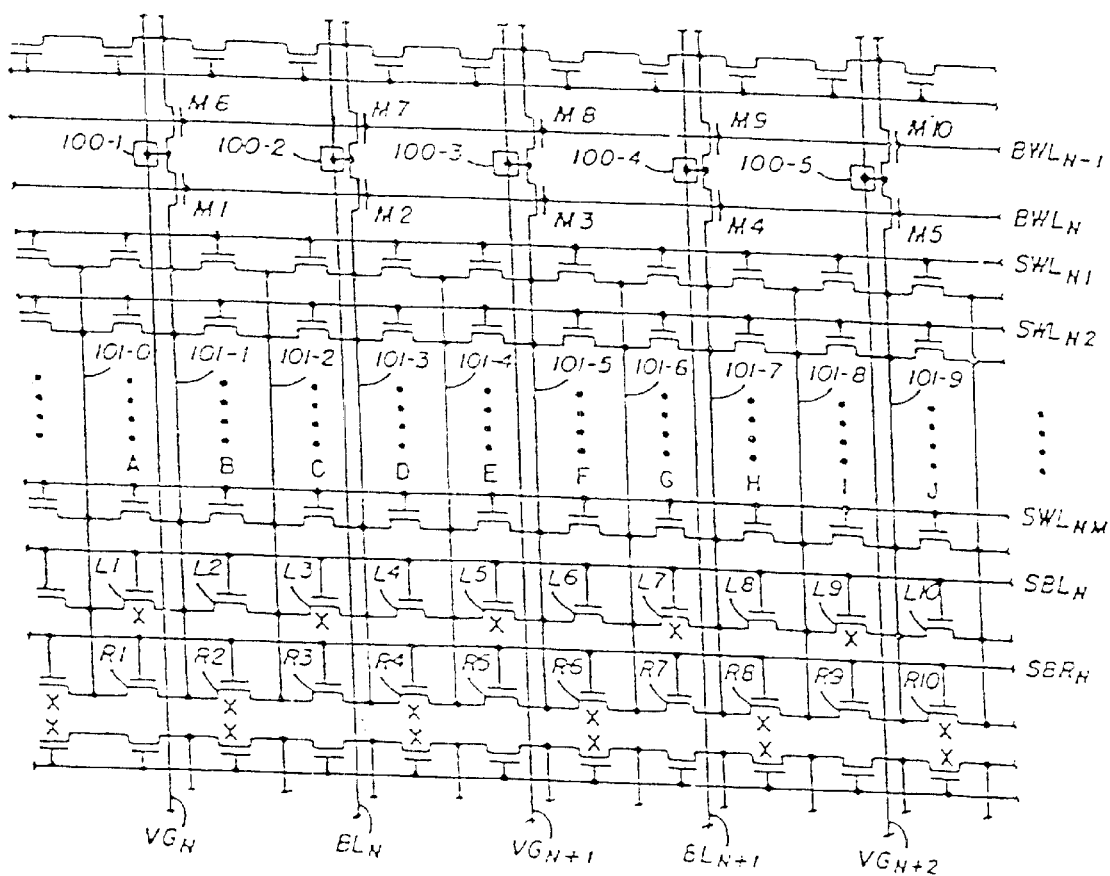
FIG. 1 is a schematic circuit diagram in accordance with the U.S. Pat. No. 5,117,389.
Figure 2:
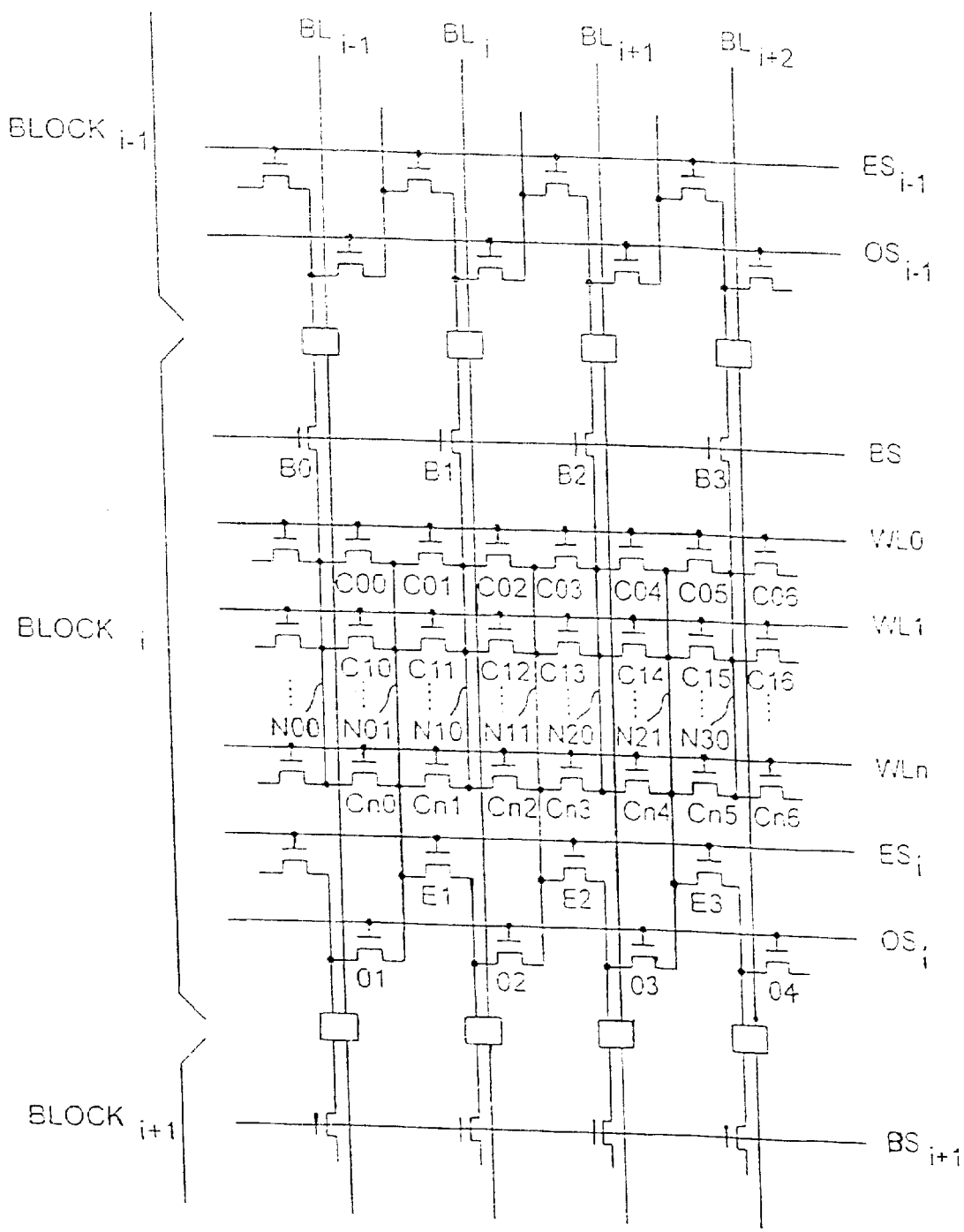
FIG. 2 is a schematic-circuit diagram in accordance with the U.S. Pat. No. 6,084,794.
Figure 3:
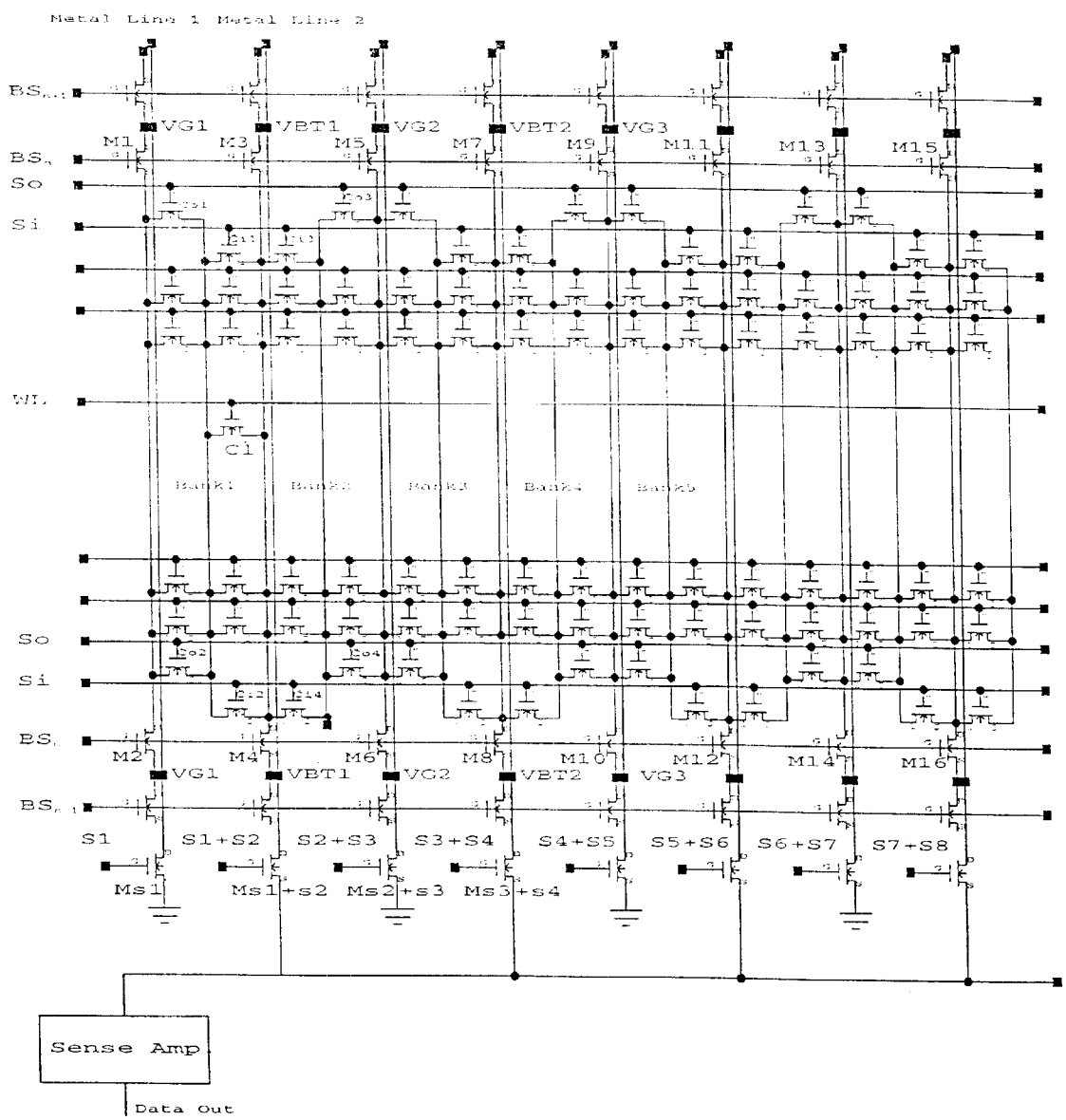
FIG. 3 is a schematic circuit diagram in accordance with the preferred embodiment of the present invention.

Please refer to FIG. 3, which is a schematic circuit diagram in accordance with the preferred embodiment of the present invention. As shown in the drawing, the circuit diagram comprises a plurality of pairs of banks, wherein each pair of banks (for example Bank 1 and Bank2) comprises: a plurality of $n^+$-buried regions formed on a substrate (not shown) to function as part of a first access path and part of a second access path; an insulating layer (not shown) of substantially constant thickness formed on the substrate; a plurality of contact holes VIA1, VIA2, VIA3 and VIA4 penetrating the insulating layer, wherein two of the contact holes VIA1 and VIA2 construct a conductive path to the ground and another two of the contact holes VIA3 and VIA4 construct a conductive path to an external sense amplifier; a plurality of block select transistors M1, M2, M3 and M4; a plurality of select cell transistors Co1, Ci1, Co2 and Ci2; a plurality of conductive bit lines, connecting the sources of the different block select transistors to the respective contact holes; a plurality of word lines; a cell array composed of the plurality of word lines to store data; and, a first metal line ML1 and a second metal line ML2, forming part of a double access path. Furthermore, the pair of banks further comprises a data storage transistor C1 for storing 0 or 1.

Figure 4:
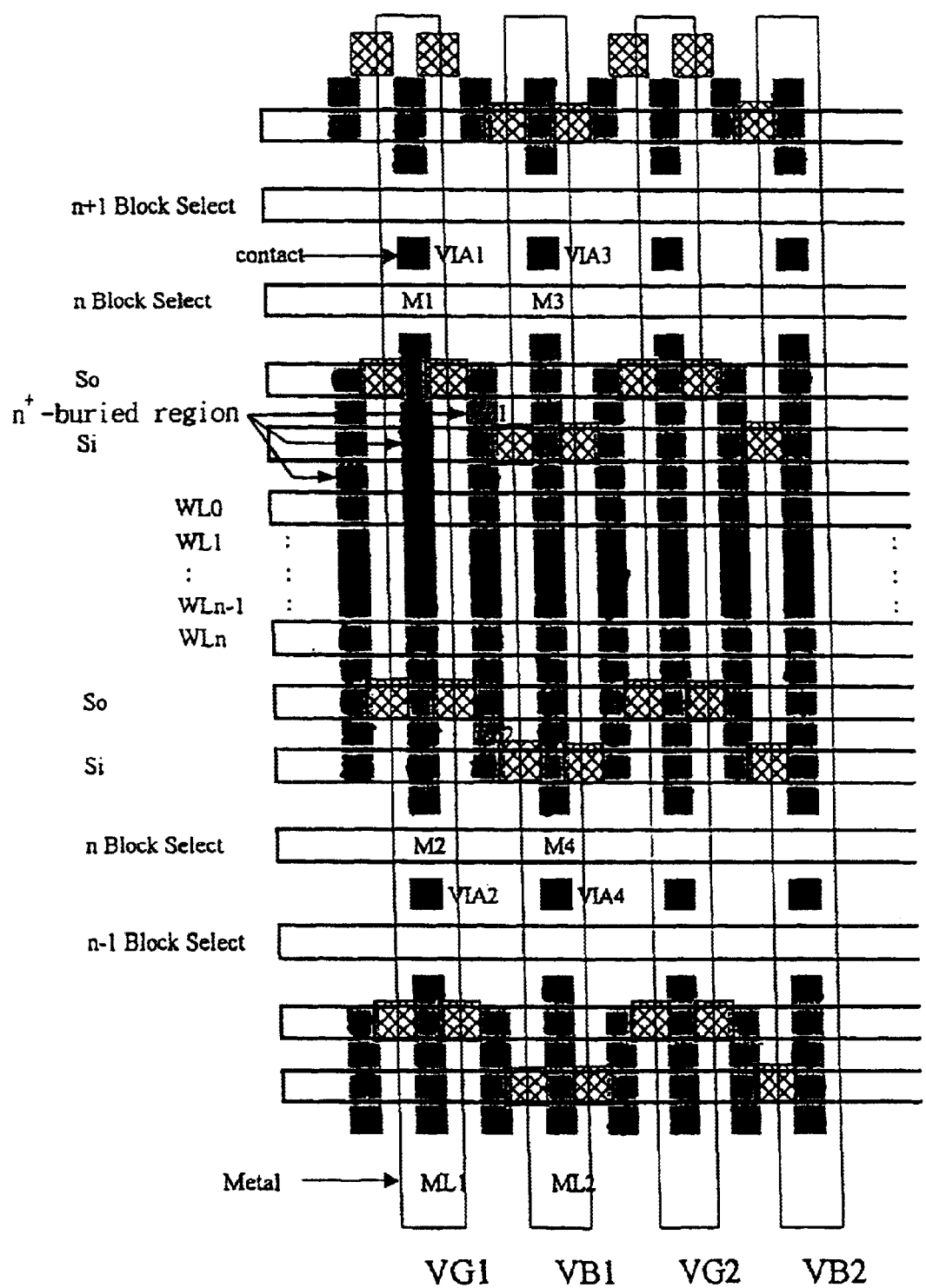
FIG. 4 is a schematic layout in accordance with the preferred embodiment of the present invention.

To further demonstrate the access paths of the circuit according to the present invention, please refer to FIG. 4, which is a schematic layout in accordance with the preferred embodiment of the present invention.

More particularly, the first access path starts from the sense amplifier through the second metal line ML2, the contact hole VIA3, the third block select transistor M3, the $n^+$-buried region B2, the data storage transistor C1, the $n^+$-buried region B1, the select cell transistor Co1, the first block select transistor M1, the contact hole VIA1 and the first metal line ML1 to the ground.

Similarly, the second access path starts from the sense amplifier through the second metal line ML2, the contact hole VIA4, the fourth block select transistor M4, the $n^+$-buried region B2, the data storage transistor C1, the $n^+$-buried region B1, the select cell transistor Co2, the second block select transistor M2, the contact hole VIA2 and the first metal line ML1 to the ground.

Therefore, when the data storage transistor C1 is to be accessed according to a decoding circuit (not shown), it is activated by a voltage decoded by the decoding circuit. Meanwhile, the double access path can be expressed as:

Sense amplifier→ML2→VIA3→M3→B2→C1→B1→Co1→
M1→VIA1→ML1→GND and

Sense amplifier→ML2→VIA4→M4→B2→C1→B1→Co2→
M2→VIA2→ML1→GND

It is preferable that the block select transistors are implemented by using n-channel MOS transistors.

It is preferable that the select cell transistors are implemented by using $n^+$-buried MOS transistors.

It is preferable that the conductive bit lines are formed of metal.

It is preferable that the word lines are formed of poly-silicon.

In other words, M3, Co1, M1 and M4, Co2, M2 construct two independent conductive paths, respectively. Therefore, the equivalent resistance of a double access path is substantially reduced since its value equals to the equivalent resistance of two parallel resistances in two independent conductive paths.

As described above, the present invention provides a double access path mask ROM array structure, characterized in that the stored data is accessed simultaneously through two access paths disposed on both sides of a memory cell structure. The reliability is improved since the value 0 or 1 stored in the data can be accessed through two paths and the operation speed is enhanced since the resistance in the conductive path from the sense amplifier to the ground is effectively reduced when accessing 0. The present invention has been examined to be progressive and has great potential in commercial applications.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A double access path mask ROM array structure, comprising a plurality of pairs of banks, wherein said each pair of banks comprises:

a plurality of $n^+$-buried regions formed on a substrate to function as part of a first access path and part of a second access path;

a plurality of contact holes, wherein two of said contact holes construct a conductive path to the ground and two of said contact holes construct a conductive path to an external sense amplifier;

a plurality of block select transistors;

a plurality of select cell transistors;

a plurality of conductive bit lines, connecting the sources of said different block select transistors to said respective contact holes;

a plurality of word lines;

a cell array composed of said plurality of word lines to store data; and a first metal line and a second metal line forming part of a double access path;

wherein, the plurality of select cell transistors is placed between the plurality of block select transistors and the cell array, the cell array being arranged into two rows.

2. The structure as recited in claim 1, wherein each pair of banks comprises a data storage transistor for storing a number selected from the group consisting of 0 and 1.

3. The structure as recited in claim 1, wherein said block select transistors are implemented by using n-channel MOS transistors.

4. The structure as recited in claim 1, wherein said cell transistors are implemented by using $n^+$-buried MOS transistors.

5. The structure as recited in claim 1, wherein said conductive bit lines are formed of metal.

6. The structure as recited in claim 1, wherein said word lines are formed of poly-silicon.

7. A double access path mask ROM array structure, comprising a plurality of pairs of banks, wherein said each pair of banks comprises:

a plurality of $n^+$-buried regions formed on a substrate to function as part of a first access path and part of a second access path;

a plurality of contact holes penetrating said insulating layer, wherein two of said contact holes construct a conductive path to the ground and two of said contact holes construct a conductive path to an external sense amplifier;

a plurality of block select transistors;

a plurality of select cell transistors;

a plurality of conductive bit lines, connecting the sources of said different block select transistors to said respective contact holes;

a plurality of word lines;

a cell array composed of said plurality of word lines to store data; and a first metal line and a second metal line forming part of a double access path;

wherein, the plurality of select cell transistors is placed between the plurality of block select transistors and the cell array, the cell array being arranged into two rows, wherein the double access path is selected from the group of paths consisting of:

i) sense amplifier to ML2 to VIA3 to M3 to B2 to C1 to B1 to Co1 to M1 to VIA1 to ML1 to GND; and ii) sense amplifier to MLZ to VIA4 to M4 to B2 to C1 to B1 to Co2 to M2 to VIA2 to ML1 to GND.

8. The structure as recited in claim 7, wherein each pair of banks comprises a data storage transistor for storing a number selected from the group consisting of 0 and 1.

9. The structure as recited in claim 7, wherein said block select transistors are implemented by using n-channel MOS transistors.

10. The structure as recited in claim 1, wherein said cell transistors are implemented by using $n^+$-buried MOS transistors.

11. The structure as recited in claim 7, wherein said conductive bit lines are formed of metal.

12. The structure as recited in claim 7, wherein said word lines are formed of poly-silicon.

* * * * *